United States Patent
Hayashi

(10) Patent No.: US 6,807,112 B2
(45) Date of Patent: Oct. 19, 2004

(54) MASK PROGRAMMABLE READ ONLY MEMORY

(75) Inventor: Mitsuaki Hayashi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/667,455

(22) Filed: Sep. 23, 2003

(65) Prior Publication Data

US 2004/0057327 A1 Mar. 25, 2004

(30) Foreign Application Priority Data

Sep. 25, 2002 (JP) ........................................ 2002-278559

(51) Int. Cl.⁷ ............................................. G11C 16/04
(52) U.S. Cl. .............................. 365/189.09; 365/230.07
(58) Field of Search ................................ 365/120, 232, 365/203, 230.07, 189.08, 189.09

(56) References Cited

U.S. PATENT DOCUMENTS 4,773,047 A  9/1988 Uchino et al. .............. 365/181
6,252,813 B1  6/2001 Liu ............................ 365/203

FOREIGN PATENT DOCUMENTS

JP   06176592   6/1994

*Primary Examiner*—Richard Elms
*Assistant Examiner*—Hien Nguyen
(74) *Attorney, Agent, or Firm*—Stevens, Davis, Miller & Mosher, LLP

(57) ABSTRACT

In view of the transistor off leakage increasing with device miniaturization, the invention provides a semiconductor integrated circuit capable of high-speed readout by eliminating the need for a charge replenishing transistor formerly required to hold a bit line at the "H" level, and thereby speeding up readout of stored data that causes the bit line to transition to the "L" level. To achieve this, a high-potential source line and a low-potential source line are provided. Then, the source of a memory cell is selectively connected to either the high-potential source line and the low-potential source line. In the case of stored data that causes the bit line potential to be held at the "H" level during readout, the source of the memory cell is connected to the high-potential source line, while in the case of stored data that causes the bit line potential to drop to the "L" level during readout, the source of the memory cell is connected to the low-potential source line.

5 Claims, 8 Drawing Sheets

MASK PROGRAMMABLE READ ONLY MEMORY

BACKGROUND OF THE INVENTION

1. Field of the Invention

The present invention relates to a semiconductor memory device comprising a semiconductor integrated circuit device. More particularly, the invention relates to a memory cell and circuit technology that achieve speed enhancement in view of process miniaturization of a mask ROM (mask programmable ROM), a type of ROM that can be programmed using a mask.

2. Description of the Prior Art

A semiconductor memory device of the prior art is disclosed, for example, in Japanese Unexamined Patent Publication No. H06-176592. In the cited patent publication, the configuration of a contact mask programmable ROM is described in paragraphs 0002 to 0006 on page 2 with reference to FIG. 2.

FIG. 7 is a circuit diagram showing the configuration of the such a contact mask programmable ROM. The contact mask programmable ROM is a ROM that stores data "1" or "0" depending on whether the drain of a memory cell transistor is connected or not connected to its associated bit line. This mask ROM can be programmed using a mask.

The semiconductor memory device of the prior art comprises, as shown in FIG. 7, a column decoder 2, a buffer 3, a precharging transistor 4, a memory cell array 7, and an off-leakage charge replenishing transistor 8.

The column decoder 2 comprises N-type MOS transistors QCj (j=1 to n). The drains of the N-type MOS transistors QCj are connected in common, while their sources are connected to respective bit lines BLj (j=1 to n), and their gates to respective column select signal lines CLj (j=1 to n).

The input end of the buffer 3 is connected to the common drain of the N-type MOS transistors QCj (j=1 to n) forming the column decoder 2, and its output end is connected to a data output terminal SOUT.

The precharging transistor 4 is constructed from a P-type MOS transistor. The gate of the precharging transistor 4 is connected to a precharge control signal line PCLK1, the source is connected to a power supply terminal having a power supply potential, and the drain is connected to the common drain of the N-type MOS transistors QCj (j=1 to n) forming the column decoder 2.

The memory cell array 7 is a matrix array of memory cells M(i, j) (i=1 to m, j=1 to n) each constructed from an N-type MOS transistor. The gates of the memory cells M(i, j) having the same value of i, that is, arranged in the same row, are connected in common to the same word line WLi (i=1 to m). The sources of these memory cells M(i, j) are connected to a ground potential line GL. The drain of each memory cell is connected to its associated bit line BLj (j=1 to n) when the data stored therein is "1", but is held in a floating state when the stored data is "0".

The off-leakage charge replenishing transistor 8 is constructed from a P-type MOS transistor. The gate of the off-leakage charge replenishing transistor 8 is connected to the output end of the buffer 3, the source is connected to the power supply terminal, and the drain is connected to the common drain of the N-type MOS transistors QCj (j=1 to n) forming the column decoder 2. The ON current of the off-leakage charge replenishing transistor 8 is chosen to be smaller than the ON current of the memory cells M(i, j) (i=1 to m, i=1 to n).

The operation for reading data from the memory cell M(1, 1) in the thus constructed semiconductor memory device will be described with reference to the timing diagram of FIG. 8.

Of the column select signal lines CLj (j=1 to n), the column select signal line CL1 is driven to the "H" level, while holding the other column select signal lines CL2 to CLn at the "L" level; as a result, of the N-type MOS transistors QCj (j=1 to n) forming the column decoder 2, the N-type MOS transistor QC1 is ON, and the other N-type MOS transistors QC2 to QCn are OFF.

Next, the precharge control signal line PCLK1 is driven to the "L" level for a period Tp, thus causing the precharging transistor 4 to turn on for the duration of the prescribed period Tp. As a result, the bit line BL1 is charged to the "H" level.

After the bit line BL1 has been charged to the "H" level, of the word lines WLi (i=1 to m) the word line WL1 is raised from the "L" level to the "H" level, while holding the other word lines WL2 to WLm at the "L" level.

Here, when the drain of the memory cell M(1, 1) is connected to the bit line BL1, the charge stored on the bit line BL1 and the charge supplied from the off-leakage charge replenishing transistor 8 are discharged through the memory cell M(1, 1), and the bit line BL1 goes to the "L" level, so that the input to the buffer 3 is also at the "L" level. As a result, after a delay of time Tac3, "H" is read out at the data output terminal SOUT, and the off-leakage charge replenishing transistor 8 turns off (indicated by dashed lines in FIG. 8).

On the other hand, when the drain of the memory cell M(1, 1) is not connected to the bit line BL1, the charge stored on the bit line BL1 is not discharged through the memory cell M(1, 1), the bit line BL1 is held at the "H" level, so that the input to the buffer 3 is also at the "H" level. As a result, "L" is read out at the data output terminal SOUT, and the off-leakage charge replenishing transistor 8 turns on. The charge being discharged due to the off-leakage currents of the other memory cells (i, 1) (i=2 to m) whose drains are connected to the bit line BL1 is replenished by the off-leakage charge replenishing transistor 8 turning on. Accordingly, the bit line BL1 is held at "H", and the data output terminal SOUT can thus continue to read out "L" (indicated by solid lines in FIG. 8).

In the prior art, the semiconductor memory device has the following problem. In the semiconductor memory device, the drains of a plurality of memory cells whose sources are grounded are connected to the same bit line, depending on the values of their stored data. As a result, a steady state current occurs on the bit line due to the off leakages of the plurality of memory cells.

Therefore, when reading data from a memory cell whose drain is not connected to the bit line, the charge being discharged as a result of the steady state current occurring due to the off leakages of the memory cells must be replenished in order to keep the bit line at the "H" level; the off-leakage charge replenishing transistor 8 is provided to supply the necessary charge to the bit line.

In recent years, with the rapid advance of miniaturization, the off-leakage current of a transistor forming a memory cell has been increasing at an extraordinarily rapid pace; as a result, the ON current of the off-leakage charge replenishing transistor for supplying charge to the bit line to make up for the charge being discharged as a result of the steady state current occurring due to the off leakages must also be increased.

For a memory cell whose drain is connected to the bit line, this in turn means that, when reading the data stored in the cell by discharging the bit line and thereby driving the bit line to the "L" level, it takes a long time for the charge supplied from the off-leakage charge replenishing transistor to be discharged through the ON current of the memory cell. The resulting problem is that the data cannot be read out at high speed.

SUMMARY OF THE INVENTION

The present invention has been devised to solve the prior art problem of the semiconductor memory device described above, and an object of the invention is to provide a semiconductor memory device that can hold the bit line at the "H" level without needing the off-leakage charge replenishing transistor, and can accomplish readout at high speed.

A semiconductor memory device according to the present invention comprises: a plurality of memory cell transistors arranged in a matrix form; a plurality of bit lines and a plurality of word lines to which drains and gates of the memory cell transistors are respectively connected; and a high-potential source line and a low-potential source line to which sources of the memory cell transistors are selectively connected. Here, the source of each of the memory cell transistors is connected by mask programming to either said high-potential source line or said low-potential source line, depending on data to be held for said each memory cell transistor.

According to the above configuration, in the case of stored data that requires its associated bit line be kept at a high potential ("H" level), the charge being discharged due to the off-leakage of deselected memory cell transistors can be replenished by connecting the source of the selected memory cell transistor to the high-potential source line. This eliminates the need for the off-leakage charge replenishing transistor provided in the prior art to replenish the charge being discharged due to the off-leakage of the deselected memory cell transistors. Since the charge is not supplied to the bit line, when driving the bit line to a low potential ("L" level) by discharging it, stored data can be read out at high speed by connecting the source of the selected memory cell to the low-potential source line.

Preferably, in the semiconductor memory device of the present invention, a plurality of high-potential source lines and a plurality of low-potential source lines are formed parallel to the plurality of bit lines.

Further, in the semiconductor memory device of the present invention, it is preferable that the high-potential source line and the low-potential source line are respectively formed in different wiring layers.

According to the above configuration, the high-potential source line and the low-potential source line can be formed one on top of the other, which serves to reduce the memory cell area.

The semiconductor memory device of the present invention may further include: a decoder for selecting one bit line from among the plurality of bit lines; and a level shifter for supplying a potential intermediate between a high potential and a low potential to the bit line selected by the decoder.

According to the above configuration, since the bit line potential need only transition from the intermediate potential to the high potential ("H" level) or the low potential ("L" level), readout can be accomplished at higher speed than in the configuration where neither the decoder nor the level shifter is provided.

In the semiconductor memory device further provided with the decoder and the level shifter described above, it is also preferable that the high-potential source line and the low-potential source line are respectively formed in different wiring layers.

According to the above configuration, the high-potential source line and the low-potential source line can be formed one on top of the other, which serves to reduce the memory cell area.

As described above, according to the present invention, the high-potential ("H" level) and low-potential ("L" level) source lines are provided, and data writing is performed by connecting the source of the memory cell transistor to one or the other of the source lines that corresponds to the stored data; as a result, without needing the off-leakage charge replenishing transistor formerly required to replenish the charge being discharging due to the steady state current occurring as a result of off leakage, the semiconductor memory device of the invention can easily accomplish the holding of the bit line at the "H" level and the high-speed readout of the stored data.

DESCRIPTION OF THE PREFERRED EMBODIMENTS

Embodiment 1

Figure 1:
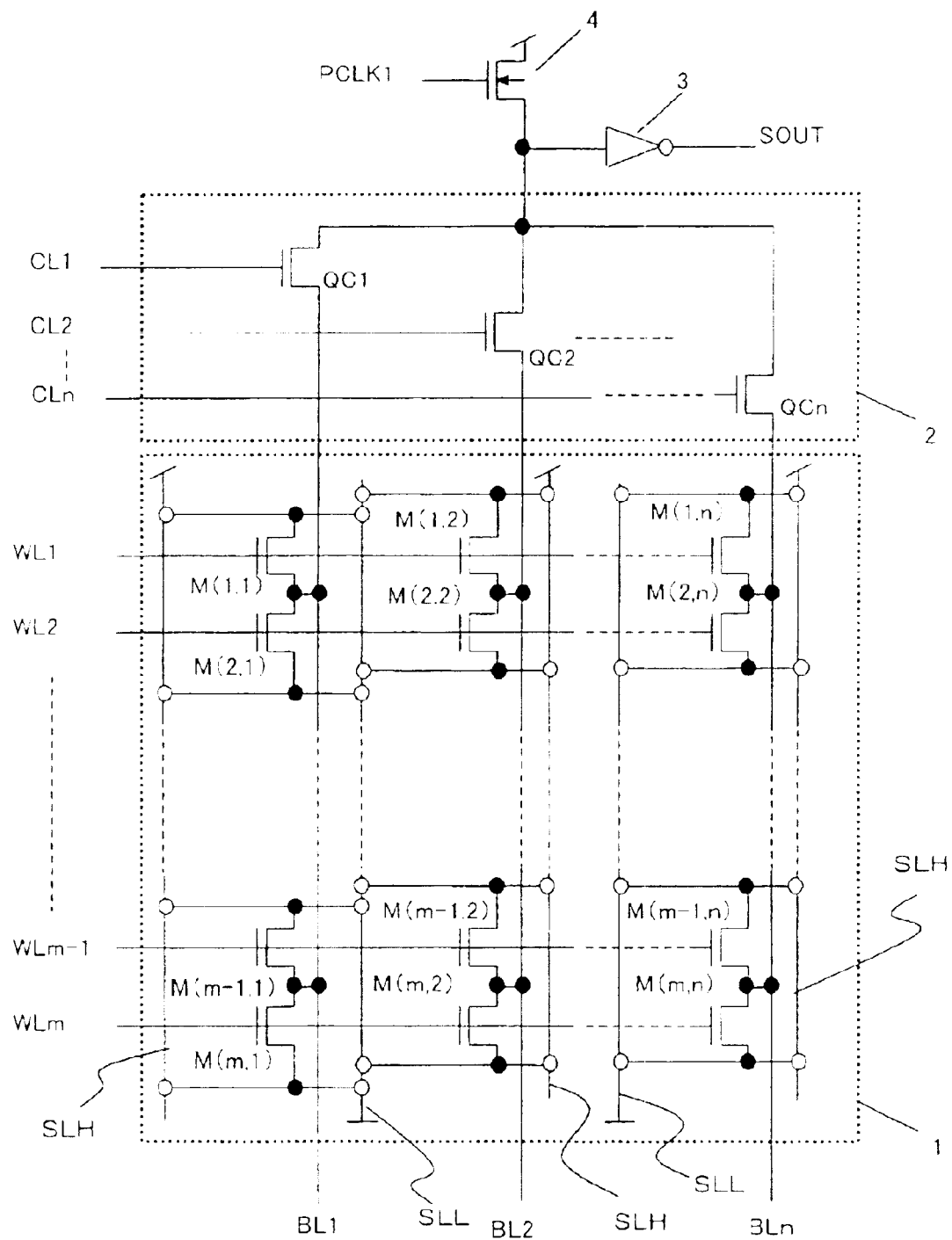
FIG. 1 is a circuit diagram showing the configuration of a semiconductor memory device according to a first embodiment of the present invention.

FIG. 1 is a circuit diagram showing the configuration of a semiconductor memory device, that is, a mask ROM, according to a first embodiment of the present invention.

As shown in FIG. 1, the semiconductor memory device of this embodiment comprises a memory cell array 1, a column decoder 2, a buffer 3, and a precharging transistor 4. The column decoder 2, the buffer 3, and the precharging transistor 4 are the same as those in the prior art configuration; therefore, the same component elements are designated by the same reference characters, and a description thereof will not be repeated here.

The memory cell array 1 is a matrix array of memory cells $M(i, j)$ (i=1 to m, j=1 to n) each constructed from an N-type MOS transistor. The gates of the memory cells M(i, j) having the same value of i, that is, arranged in the same row, are connected in common to the same word line WLi (i=1 to m). The drains of these memory cells M(i, j) are connected to respective bit lines BLj (j=1 to n). The source of each memory cell is connected to a low-potential "L" level source line SLL adjacent to its associated bit line when the data stored therein is "1", but is connected to a high-potential "H" level source line SLH adjacent to the bit line when the stored data is "0".

Figure 2:
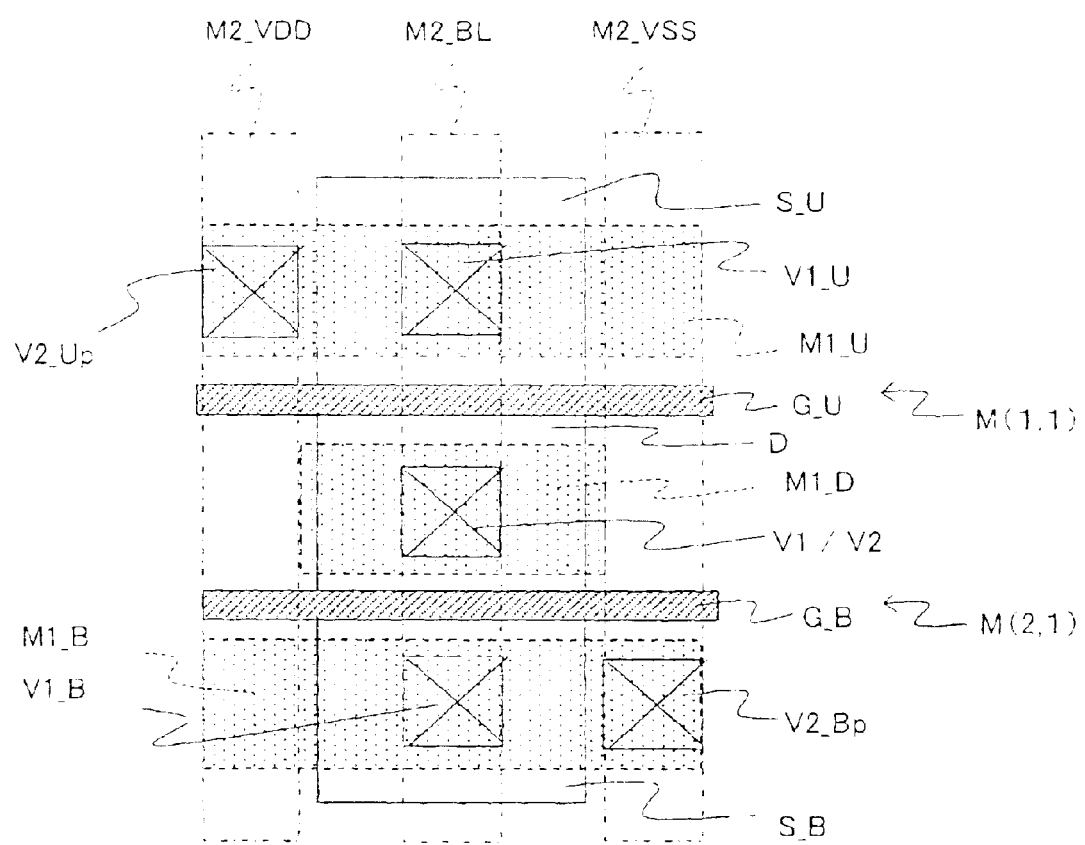
FIG. 2 is a schematic diagram showing a memory cell layout for the semiconductor memory device according to the first embodiment of the present invention.

FIG. 2 shows a mask layout for a portion of the memory cell array 1, for example, the memory cell M(1, 1) and the memory cell M(2, 1).

In FIG. 2, reference character M2__BL indicates a bit line formed from a second layer metal. This bit line M2__BL corresponds to the bit line BL1 in FIG. 1. Reference character M2__VDD indicates a high-potential "H" level source line formed from the second layer metal. This high-potential source line M2__VDD corresponds to the high-potential source line SLH in FIG. 1. Reference character M2__VSS indicates a low-potential "L" level source line formed from the second layer metal. This low-potential source line M2__VSS corresponds to the low-potential source line SLL in FIG. 1.

Reference character D indicates the drain of the memory cells M(1, 1) and M(2, 1). Reference character V1 indicates a via hole connecting between the drain D and a first layer metal M1__D above the drain. Reference character V2 indicates a via hole connecting between the first layer metal M1__D and the bit line M2__BL.

Reference characters G__U and G__B indicate the gates of the respective memory cells M(1, 1) and M(2, 1). Reference characters S__U and S__B indicate the sources of the respective memory cells M(1, 1) and M(2, 1). Reference characters V1__U and V1__B indicate via holes respectively connecting between the sources S__U and S__B of the respective memory cells M(1, 1) and M(2, 1) and first layer metal lines M1__U and M1__B above the respective sources S__U and S__B.

Reference characters V2__Up and V2__Bp indicate via holes connecting between the first layer metal and the second layer metal for data writing in the respective memory cells M(1, 1) and M(2, 1).

In the illustrated example, the data stored in the memory cell M(1, 1) is "0", and the data stored in the memory cell M(2, 1) is "1".

Figure 3:
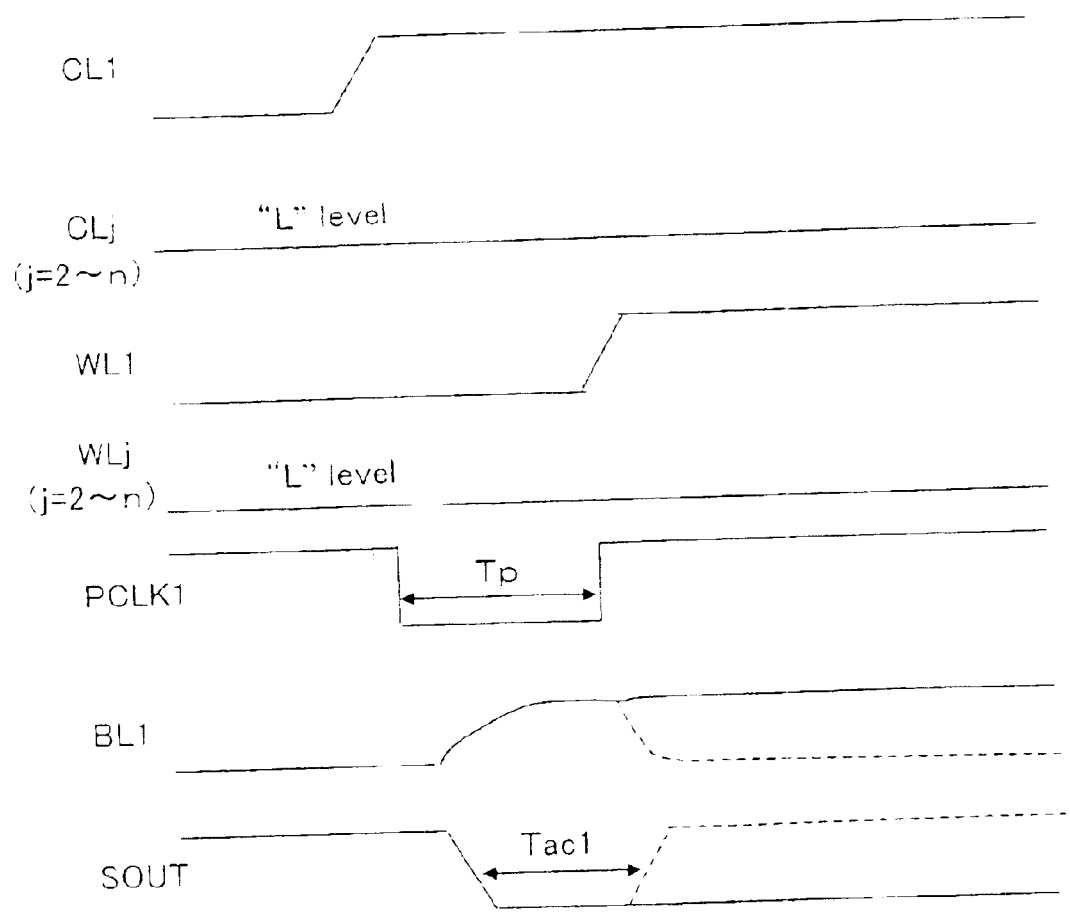
FIG. 3 is a timing diagram illustrating the operation of the semiconductor memory device according to the first embodiment of the present invention.

The operation for reading the data from the memory cell M(1, 1) in the thus constructed semiconductor memory device will be described with reference to the timing diagram of FIG. 3.

Of the column select signal lines CLj (j=1 to n), the column select signal line CL1 is driven to the "H" level, while holding the other column select signal lines CL2 to CLn at the "L" level; as a result, of the N-type MOS transistors QC1 to QCn forming the column decoder 2, the N-type MOS transistor QC1 is ON, and the other N-type MOS transistors QC2 to QCn are OFF.

Next, the precharge control signal line PCLK1 is driven to the "L" level for a period Tp, thus causing the precharging transistor 4 to turn on for the duration of the prescribed period Tp. As a result, the bit line BL1 is charged to the "H" level.

After the bit line BL1 has been charged to the "H" level, of the word lines WLi (i=1 to m) the word line WL1 is raised from the "L" level to the "H" level, while holding the other word lines WL2 to WLm at the "L" level.

Here, when the source of the memory cell M(1, 1) is connected to the low-potential "L" level source line SLL, the charge stored on the bit line BL1 is discharged through the memory cell M(1, 1), and the bit line BL1 goes to the "L" level, so that the input to the buffer 3 is also at the "L" level. As a result, after a delay of time Tac1, "H" is read out at the data output terminal SOUT (indicated by dashed lines in FIG. 3).

On the other hand, when the source of the memory cell M(1, 1) is connected to the high-potential "H" level source line SLH, the charge stored on the bit line BL1 is not discharged through the memory cell M(1, 1), thereby the bit line BL1 is held at the "H" level, so that the input to the buffer 3 is also at the "H" level. As a result, "L" is read out at the data output terminal SOUT. The charge being discharged due to the off-leakage currents of the other memory cells (i, 1) (i=2 to m) whose drains are connected to the bit line BL1 is replenished from the memory cell M(1, 1). Accordingly, the bit line BL1 is held at "H", and the data output terminal SOUT can thus continue to read out "L" (indicated by solid lines in FIG. 3).

As described above, according to the present embodiment, the charge is replenished from the memory cell in the case of the stored data that requires the charge on the bit line be retained; therefore, in the case of the stored data that discharges the bit line, the elimination of the off-leakage charge replenishing transistor shown in the prior art serves to improve the readout time Tac1, that is Tac1<Tac3

High-speed readout can thus be achieved. In this way, the present embodiment does not need the provision of the off-leakage charge replenishing transistor for replenishing the charge being discharged due to the steady state current occurring as a result of off-leakage. As a result, the bit line can be held at the "H" level, and readout can be accomplished at high speed.

Embodiment 2

FIG. 4 shows a memory cell layout for a semiconductor memory device according to a second embodiment of the present invention. The configuration and operation of the semiconductor memory device are the same as those of the first embodiment, and therefore, a description thereof will not be repeated here.

Figure 4A:
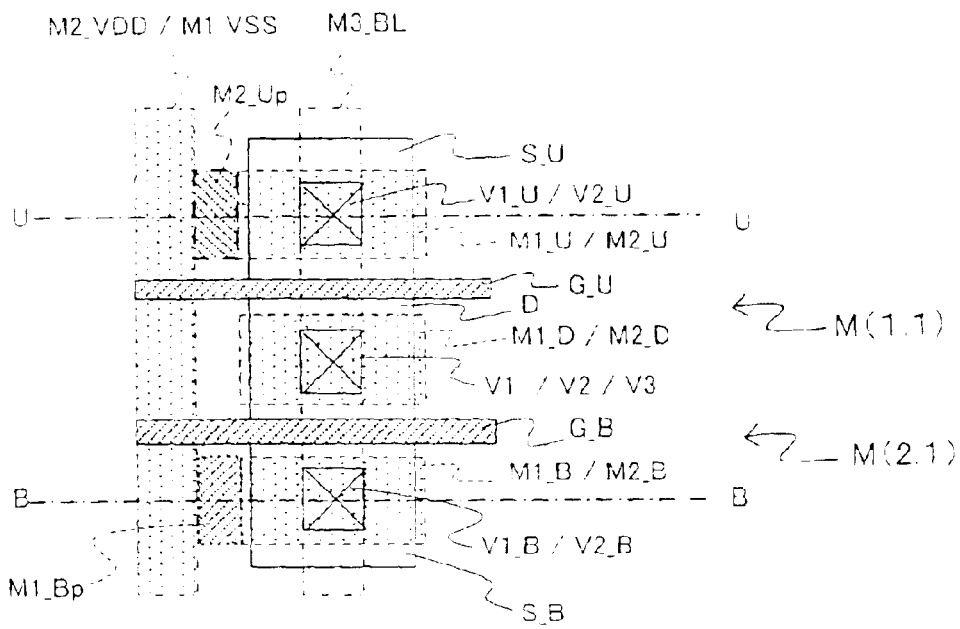
FIG. 4A is a plan view showing a memory cell layout for a semiconductor memory device according to a second embodiment of the present invention.
Figure 4B:
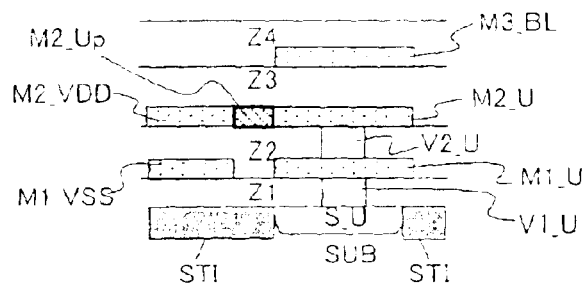
FIG. 4B is a cross sectional view taken along dashed line U in FIG. 4A.
Figure 4C:
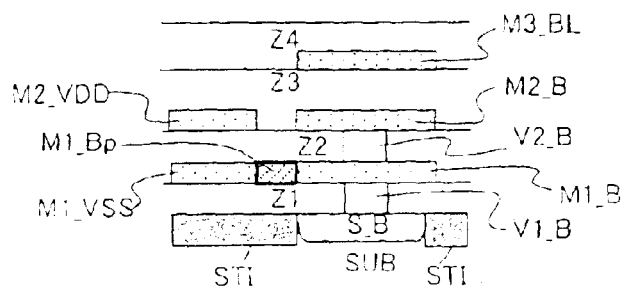
FIG. 4C is a cross sectional view taken along dashed line B in FIG. 4A.

FIG. 4A is a plan view, FIG. 4B is a cross sectional view taken along dashed line U in FIG. 4A, and FIG. 4C is a cross sectional view taken along dashed line B in FIG. 4A.

Referring to FIG. 4, a description will be given below by taking the memory cells M(1, 1) and M(2, 1) as an example, as in the first embodiment.

Reference character M3__BL indicates a bit line formed from a third layer metal. This bit line corresponds to the bit line BL1 in FIG. 1. Reference character M2__VDD indicates a high-potential "H" level source line formed from a second layer metal. This high-potential source line M2__VDD corresponds to the high-potential source line SLH in FIG. 1. Reference character ML__VSS indicates a low-potential "L" level source line formed from a first layer metal. This low-potential source line ML__VSS corresponds to the low-potential source line SLL in FIG. 1.

Reference character D indicates the drain of the memory cells M(1, 1) and M(2, 1). Reference character V1 indicates a via hole connecting between the drain D and the first layer metal M1__D above the drain. Reference character V2 indicates a via hole connecting between the first layer metal M1__D and the second layer metal M2__D above the drain. Reference character V3 indicates a via hole connecting between the second layer metal M2__D and the bit line M3__BL.

Reference characters G_U and G_B indicate the gates of the respective memory cells M(1, 1) and M(2, 1). Reference characters S_U and S_B indicate the sources of the respective memory cells M(1, 1) and M(2, 1). Reference characters V1_U and V1_B indicate via holes respectively connecting between the sources S_U and S_B of the respective memory cells M(1, 1) and M(2, 1) and first layer metal lines M1_U and M1_B above the respective sources S_U and S_B. Reference characters V2_U and V2_B indicate via holes respectively connecting between the first layer metal lines M1_U and M1_B above the sources of the respective memory cells M(1, 1) and M(2, 1) and second layer metal lines M2_U and M2_B above the respective sources.

Reference character SUB indicates the substrate. Reference character ST1 indicates an isolation layer. Reference characters Z1, Z2, Z3, and Z4 indicate first, second, third, and fourth insulating films, respectively.

Reference characters M2_Up and M1_Bp indicate the second layer metal and first layer metal, respectively, for data writing.

In the illustrated example, the data stored in the memory cell M(1, 1) is "0", and the data stored in the memory cell M(2, 1) is "1".

As described above, according to the present embodiment, in addition to the effect of the first embodiment, the "H" level high-potential source lines SLH and "L" level low-potential source lines SLL can be formed one on top of the other by using metal wiring lines in different layers as the "H" level and "L" level source lines. As a result, the memory cell area can be reduced.

Embodiment 3

Figure 5:
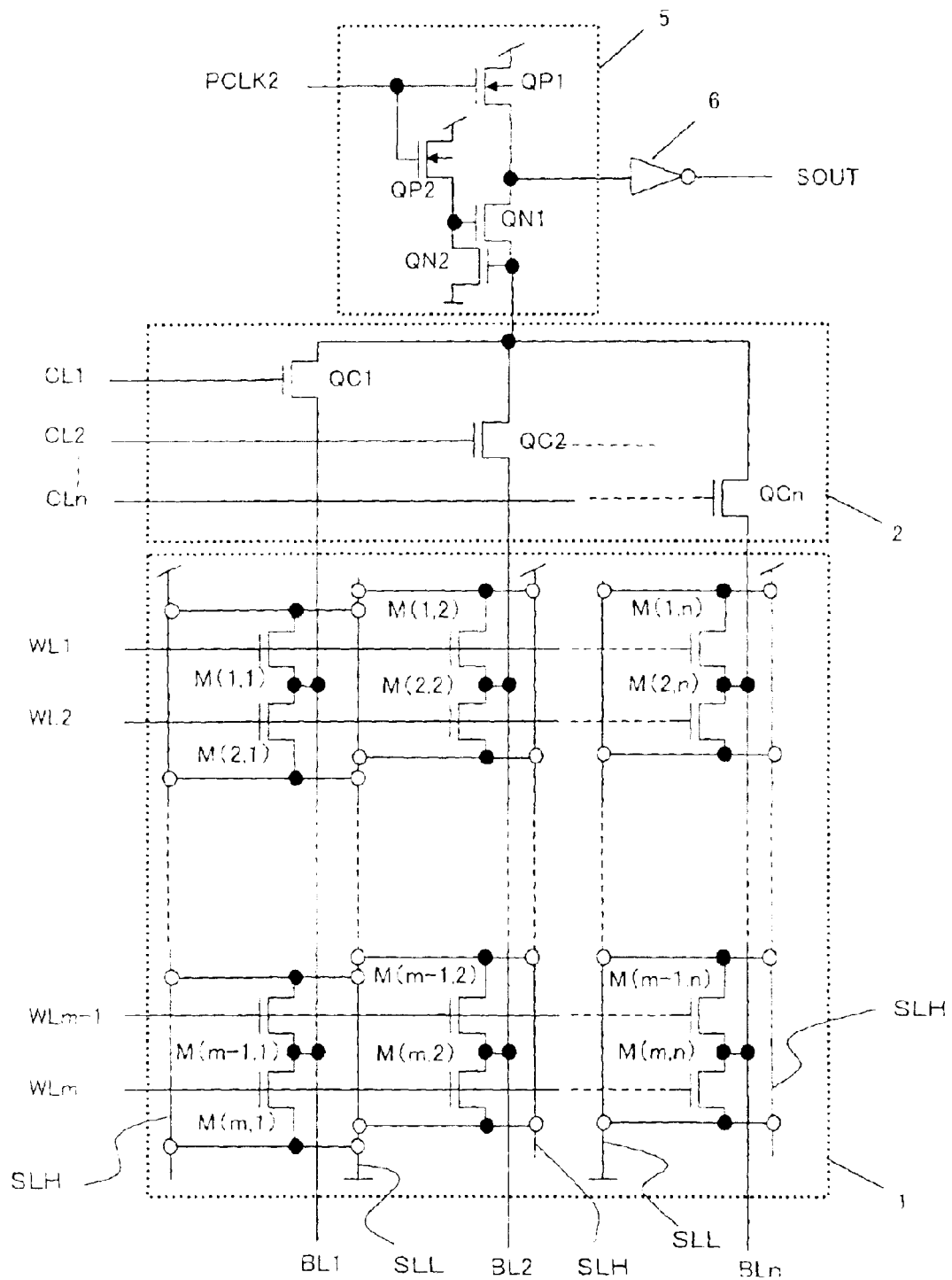
FIG. 5 is a circuit diagram showing the configuration of a semiconductor memory device according to a third embodiment of the present invention.

FIG. 5 is a circuit diagram showing the configuration of a semiconductor memory device according to a third embodiment.

As shown in FIG. 5, the semiconductor memory device of this embodiment comprises a memory cell array 1, a column decoder 2, a level shifter 5, and a buffer 6. The memory cell array 1 and the column decoder 2 are the same as those in the first embodiment; therefore, the same component elements are designated by the same reference characters, and a description thereof will not be repeated here.

The level shifter 5 comprises P-type MOS transistors QP1 and QP2 and N-type MOS transistors QN1 and QN2.

The source of the P-type MOS transistor QP1 is connected to the power supply terminal, the gate is connected to the precharge signal line PCLK2, and the drain is connected to the drain of the N-type MOS transistor QN1.

The source of the P-type MOS transistor QP2 is connected to the power supply terminal, the gate is connected to the precharge signal line PCLK2, and the drain is connected to the drain of the N-type MOS transistor QN2.

The drain of the N-type MOS transistor QN1 is connected to the drain of the P-type MOS transistor QP1, the gate is connected to the drain of the P-type MOS transistor QP2, and the source is connected to the common drain of the N-type MOS transistors QCj (j=1 to n) forming the column decoder 2.

The drain of the N-type MOS transistor QN2 is connected to the drain of the P-type MOS transistor QP2, the gate is connected to the common drain of the N-type MOS transistors QCj (j=1 to n) forming the column decoder 2, and the source is connected to the ground terminal having a ground potential.

The input terminal of the buffer 6 is connected to the drain of the P-type MOS transistor QP1 in the level shifter 5, and the output terminal is connected to the output terminal SOUT.

Figure 6:
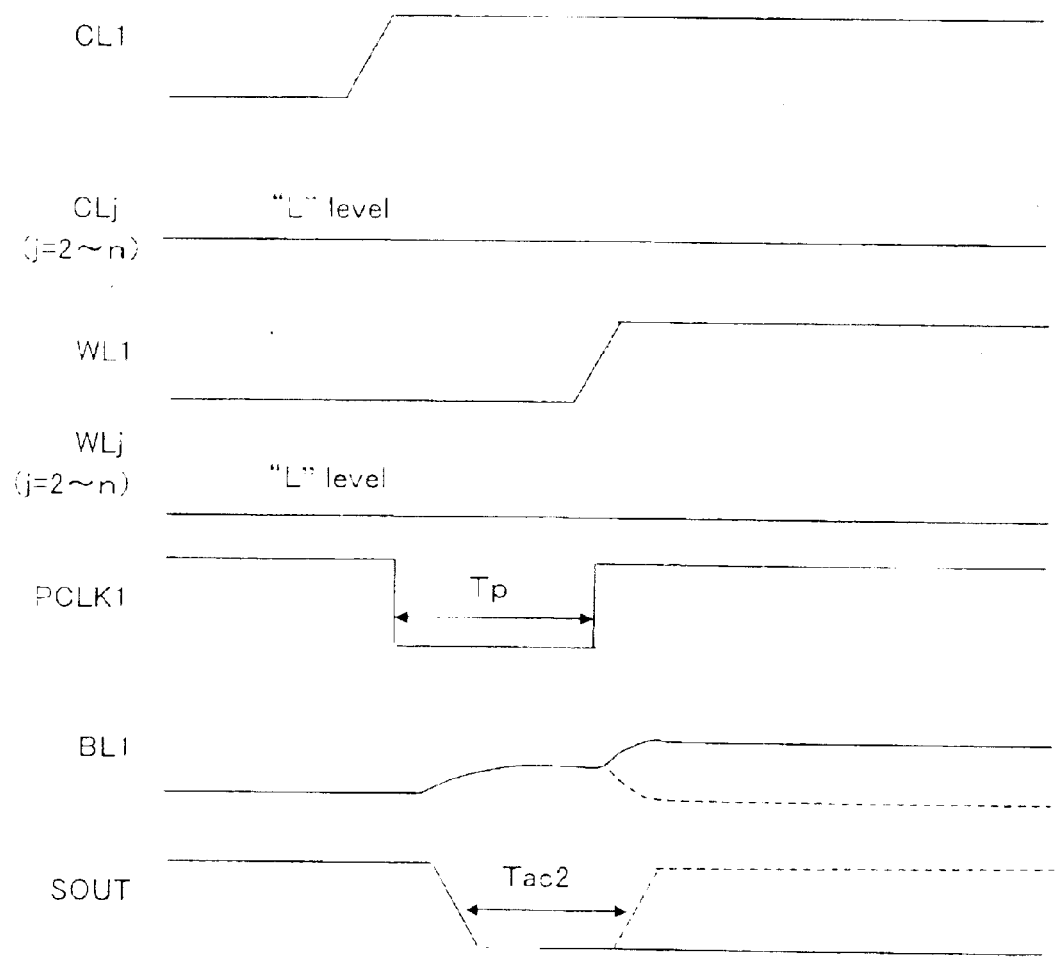
FIG. 6 is a timing diagram illustrating the operation of the semiconductor memory device according to the third embodiment of the present invention.
Figure 7:
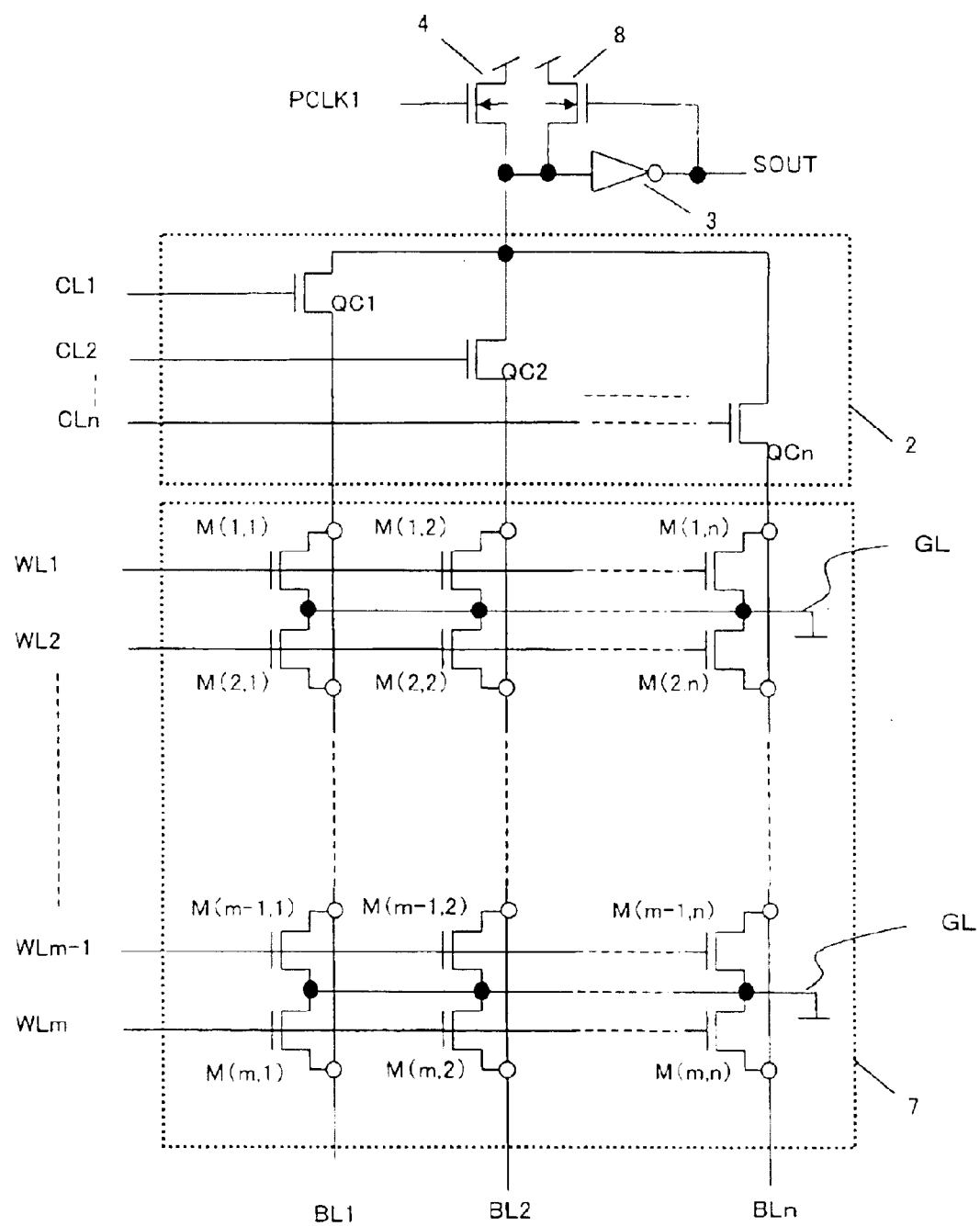
FIG. 7 is a circuit diagram showing the configuration of a semiconductor memory device according to the prior art.
Figure 8:
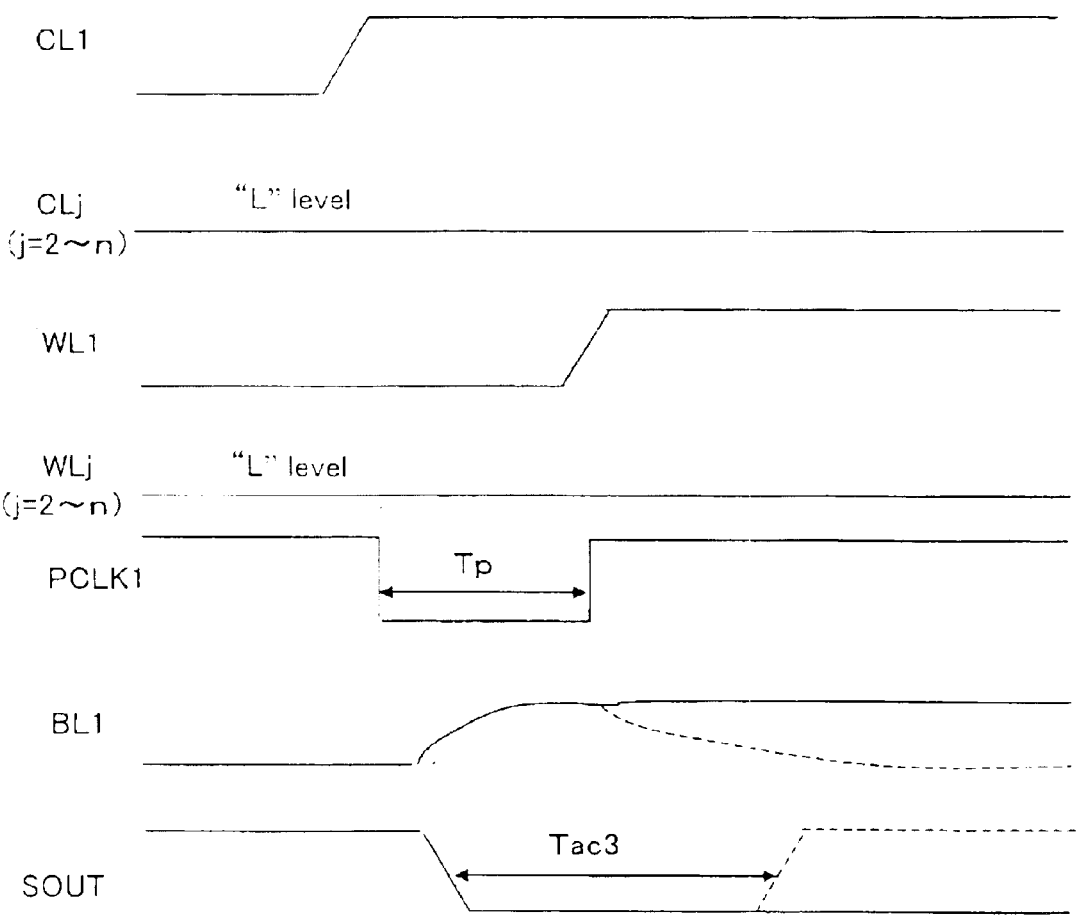
FIG. 8 is a timing diagram illustrating the operation of the semiconductor memory device according to the prior art.

The operation for reading data from the memory cell M(1, 1) in the thus constructed semiconductor memory device will be described with reference to the timing diagram of FIG. 6.

Of the column select signal lines CLj (j=1 to n), the column select signal line CL1 is driven to the "H" level, while holding the other column select signal lines CL2 to CLn at the "L" level; as a result, of the N-type MOS transistors QC1 to QCn forming the column decoder 2, the N-type MOS transistor QC1 is ON, and the other N-type MOS transistors QC2 to QCn are OFF.

Next, the precharge control signal line PCLK2 is driven to the "L" level for a period Tp, thus causing the P-type MOS transistor QP1 and QP2 in the level shifter 5 to turn on for the duration of the prescribed period Tp. Accordingly, the N-type MOS transistor QN1 turns on, and the N-type MOS transistor QN2 also turns on at the same time. As a result, the bit line BL1 and the common drain of the N-type MOS transistors QCj (j=1 to n) forming the column decoder 2 are charged to an intermediate potential (potential between the "H" level and the "L" level).

After the bit line BL1 has been charged to the intermediate potential, of the word lines WLi (i=1 to m) the word line WL1 is raised from the "L" level to the "H" level, while holding the other word lines WL2 to WLm at the "L" level.

Here, when the source of the memory cell M(1, 1) is connected to the low-potential "L" level source line SLL, the charge stored on the bit line BL1 is discharged through the memory cell M(1, 1), and the bit line BL1 goes to the "L" level, so that the input to the buffer 6 is also at the "L" level. As a result, after a delay of time Tac2, "H" is read out at the data output terminal SOUT (indicated by dashed lines in FIG. 6).

On the other hand, when the source of the memory cell M(1, 1) is connected to the high-potential "H" level source line SLH, the charge stored on the bit line BL1 is not discharged through the memory cell M(1, 1), the bit line BL1 is held at the "H" level, so that the input to the buffer 6 is also at the "H" level. As a result, "L" is read out at the data output terminal SOUT. The charge being discharged due to the off-leakage currents of the other memory cells (i, 1) (i=2 to m) whose drains are connected to the bit line BL1 is replenished from the memory cell M(1, 1). Accordingly, the bit line BL1 is held at "H", and the data output terminal SOUT can thus continue to read out "L" (indicated by solid lines in FIG. 6).

As described above, according to the present embodiment, since the bit line is charged to the intermediate potential, the time required for the data output terminal SOUT to make a transition to the "L" level can be reduced compared with the first embodiment, and the readout time Tac2 becomes faster than the first embodiment, that is Tac2<Tac1

High-speed readout can thus be achieved.

What is claimed is:

1. A semiconductor memory device comprising: a plurality of memory cell transistors arranged in a matrix form; a plurality of bit lines and a plurality of word lines to which drains and gates of said memory cell transistors are respectively connected; and a high-potential source line and a low-potential source line to which sources of said memory cell transistors are selectively connected, wherein the source of each of the memory cell transistors is connected by mask programming to either said high-potential source line or said low-potential source line, depending on data to be held for said each memory cell transistor.

2. A semiconductor memory device as set forth in claim 1, wherein a plurality of said high-potential source lines and a plurality of said low-potential source lines are formed parallel to said plurality of bit lines.

3. A semiconductor memory device as set forth in claim 1, wherein said high-potential source line and said low-potential source line are respectively formed in different wiring layers.

4. A semiconductor memory device as set forth in claim 2, wherein said high-potential source lines and said low-potential source lines are respectively formed in different wiring layers.

5. A semiconductor memory device as set forth in claim 1, further comprising: a decoder for selecting one bit line from among said plurality of bit lines; and a level shifter for supplying a potential intermediate between a high potential and a low potential to said bit line selected by said decoder.

* * * * *